United States Patent
Jang et al.

(10) Patent No.: US 7,719,111 B2
(45) Date of Patent: May 18, 2010

(54) NANOWIRE ELECTROMECHANICAL DEVICE AND METHOD OF FABRICATING THE SAME

(75) Inventors: Jae-Eun Jang, Seoul (KR); Seung-Nam Cha, Seoul (KR); Yong-Wan Jin, Seoul (KR); Byong-Gwon Song, Seoul (KR)

(73) Assignee: Samsung SDI Co., Ltd., Yeongtong-gu, Suwon-si, Gyeonggi-do (KR)

( * ) Notice: Subject to any disclaimer, the term of this patent is extended or adjusted under 35 U.S.C. 154(b) by 77 days.

(21) Appl. No.: 11/408,054

(22) Filed: Apr. 21, 2006

(65) Prior Publication Data

US 2007/0051970 A1    Mar. 8, 2007

(30) Foreign Application Priority Data

Sep. 6, 2005    (KR) ............... 10-2005-0082624

(51) Int. Cl.
  *H01L 21/28* (2006.01)
(52) U.S. Cl. .................. 257/741; 29/622; 977/762; 257/E51.04; 257/784; 257/761; 257/764
(58) Field of Classification Search ............. 257/E29.07
  See application file for complete search history.

(56) References Cited

U.S. PATENT DOCUMENTS

| | | | | |
|---|---|---|---|---|
| 6,990,009 B2* | 1/2006 | Bertin et al. | ................ | 365/151 |
| 7,087,920 B1* | 8/2006 | Kamins | ..................... | 257/2 |
| 2001/0021564 A1* | 9/2001 | Katori | ...................... | 438/396 |
| 2004/0075464 A1* | 4/2004 | Samuelson et al. | ............. | 326/37 |
| 2004/0160154 A1* | 8/2004 | Nishimura et al. | ............ | 313/113 |
| 2006/0079455 A1* | 4/2006 | Gazit et al. | ..................... | 514/12 |
| 2006/0266402 A1* | 11/2006 | Zhang et al. | ................. | 136/205 |

OTHER PUBLICATIONS

Intermolecular Bonding—Van Der Waals Forces at http://www.chemguide.co.uk/atoms/bonding/vdw.html, Published in 2000 and "slightly modified" in 2007.

* cited by examiner

*Primary Examiner*—Minh-Loan T Tran
*Assistant Examiner*—Fei Fei Yeung Lopez
(74) *Attorney, Agent, or Firm*—Robert E. Bushnell, Esq.

(57) ABSTRACT

A nanowire electronmechanical device with an improved structure and a method of fabricating the same prevent burning of two nanowires which are switched due to contact with each other while providing stable on-off switching characteristics. The nanowire electromechanical device comprises: an insulating substrate; first and third electrodes spaced apart from each other on the insulating substrate, wherein a negative voltage and a positive voltage, varying within a predetermined range, are applied to the first and third electrodes, respectively; a second electrode interposed between the first and third electrodes, a constant positive voltage, lower than the voltage applied to the third electrode, being applied to the second electrode; a first nanowire vertically grown on the first electrode and charged with a negative charge; a second nanowire vertically grown on the second electrode and charged with a positive charge; and a third nanowire vertically grown on the third electrode and charged with an amount of positive charge corresponding to the magnitude of the varying voltage applied to the third electrode.

37 Claims, 8 Drawing Sheets

NANOWIRE ELECTROMECHANICAL DEVICE AND METHOD OF FABRICATING THE SAME

CLAIM OF PRIORITY

This application makes reference to, incorporates the same herein, and claims all benefits accruing under 35 U.S.C. §119 from an application for NANOWIRE ELECTROMECHANICAL DEVICE AND FABRICATION METHOD OF THE SAME, earlier filed in the Korean Intellectual Property Office on the 6 of Sep. 2005 and there, duly assigned Serial No. 10-2005-0082624.

BACKGROUND OF THE INVENTION

1. Technical Field

The present invention relates to a switching device and, more particularly, to a nanowire electronmechanical device with an improved structure that can prevent burning of two nanowires caused by their being switched on by contacting each other, while providing stable on-off switching characteristics, and a method of fabricating the same.

2. Related Art

A nanowire switching device includes an insulating substrate, first and second electrodes disposed on the insulating substrate, and first and second nanowires vertically grown on the first and second electrodes, respectively. When a predetermined voltage difference is applied between the first and second electrodes, positive and negative charges are accumulated on the first and second nanowires, respectively. An attractive electrostatic force acts between the first and second nanowires to electrically deform the first and second nanowires so that distal ends of the first and second nanowires contact each other and are switched on. However, a high driving voltage of 25 V to 50 V should be applied between the first and second electrodes to induce elastic deformation of the nanowires for the two-electrode switching device. When the high driving voltage is applied, high current flows through the nanowires, which can lead to arcing or burning of the distal ends of the nanowires when they contact each other. The arcing or burning not only degrades switching characteristics but also reduces the lift span of the switching device.

SUMMARY OF THE INVENTION

The present invention provides a nanowire electronmechanical device with an improved structure which can prevent burning of two nanowires when they are switched on by contacting each other, while providing stable on-off switching characteristics, and a method of fabricating the same.

According to an aspect of the present invention, a nanowire electromechanical device comprises: an insulating substrate; first, second and third electrodes spaced apart from each other on the insulating substrate, a negative voltage and a positive voltage varying within a predetermined range being applied to the first and third electrodes, respectively, the second electrode being interposed between the first and third electrodes, a constant positive voltage, lower than the voltage applied to the third electrode, being applied to the second electrode; a first nanowire vertically grown on the first electrode and charged with negative charge; a second nanowire vertically grown on the second electrode and charged with positive charge; and a third nanowire vertically grown on the third electrode and charged with an amount of positive charge corresponding to the magnitude of the varying voltage applied to the third electrode. The nanowire electromechanical device having the above-mentioned configuration allows distal ends of the first and second nanowires to be in contact or non-contact with each other by electrostatic forces among the first thru third nanowires controlled according to the amount of charge at the third nanowire, elastic restoring forces of the first thru third nanowires, and Van der Waals forces acting on the first thru third nanowires, thereby providing switching characteristics.

Alternatively, the nanowire electromechanical device may comprise: an insulating substrate; first and second electrodes spaced apart from each other on the insulating substrate, wherein a negative voltage and a positive voltage varying within a predetermined range are applied to the first and second electrodes, respectively; a third electrode interposed between the first and second electrodes, a constant positive voltage lower than the voltage applied to the second electrode being applied to the third electrode; a first nanowire vertically grown on the first electrode and charged with negative charge; and a second nanowire vertically grown on the second electrode and charged with a positive charge. The nanowire electromechanical device having the above-mentioned configuration allows the distal ends of the first and second nanowires to be in contact or non-contact with each other by electrostatic forces among the first and second nanowires, and the third electrode controlled according to the magnitude of the voltage applied to the third electrode, elastic restoring forces of the first thru third nanowires, and Van der Waals forces acting between the first thru third nanowires, thereby providing switching characteristics.

Each of the first thru third electrodes is formed of at least one material selected from the group consisting of niobium (Nb), chrome (Cr), molybdenum (Mo), tungsten (W), titanium (Ti), platinum (Pt), gold (Au), indium tin oxide (ITO), and silver (Ag). Each of the first thru third nanowires is formed of one material selected from the group consisting of carbon-based material, Pt-based material, Si-based material, GaN-based material, GaAs-based material, and ZnO-based material. For example, each of the first thru third nanowires may be formed of one material selected from the group consisting of carbon fiber, carbon nanotube (CNT), Pt wire, Si wire, GaN wire, GaAs wire, and ZnO wire. Each of the first thru third nanowires may have a diameter of 70 nm and a height of 1 to 3 μm.

The voltage difference between the first and third electrodes is less than 100 V.

The voltage applied to the third electrode is lower than 100 V. The voltage applied to the second electrode is lower than 50 V.

According to another aspect of the present invention, a method of fabricating a nanowire electromechanical device comprises the steps of: preparing an insulating substrate; forming an electrode layer on the insulating substrate; patterning the electrode layer to form first thru third electrodes spaced apart from one another and disposed sequentially in a row; and vertically growing first and second nanowires on the first and second electrodes, respectively.

The step of vertically growing the first and second nanowires includes the steps of depositing catalysts on the first and second electrodes, and growing the first and second nanowires on the catalysts. The catalyst is formed of at least one material selected from the group consisting of nickel (Ni), invar, iron (Fe), cobalt (Co), and gold (Au). The electrode layer is formed of at least one material selected from the group consisting of Nb, Cr, Mo, W, Ti, Pt, Au, ITO, and Ag. The first and second nanowires are formed of one material selected from the group consisting of carbon-based material, Pt-based material, Si-based material, GaN-based material, GaAs-based material, and ZnO-based material. For example, the first or second nanowire may be formed of one material selected from the group consisting of carbon fiber, carbon nanotube (CNT), Pt wire, Si wire, GaN wire, GaAs wire, and ZnO wire. The first and second nanowires may have a diameter of 70 nm and a height of 1 to 3 μm.

The fabrication method may further include the step of vertically growing a third nanowire on the third electrode. The step of vertically growing the third nanowire includes depositing a catalyst on the third electrode, and growing the third nanowire on the catalyst.

The third nanowire is formed of one material selected from the group consisting of carbon-based material, Pt-based material, Si-based material, GaN-based material, GaAs-based material, and ZnO-based material. For example, the third nanowire is formed of one material selected from the group consisting of carbon fiber, carbon nanotube (CNT), Pt wire, Si wire, GaN wire, GaAs wire, and ZnO wire. The third nanowire may have a diameter of 70 nm and a height of 1 to 3 μm.

The nanowire electromechanical device having the above-mentioned configuration provides stable on-off switching characteristics while preventing burning of two nanowires when they are switched on by contacting each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
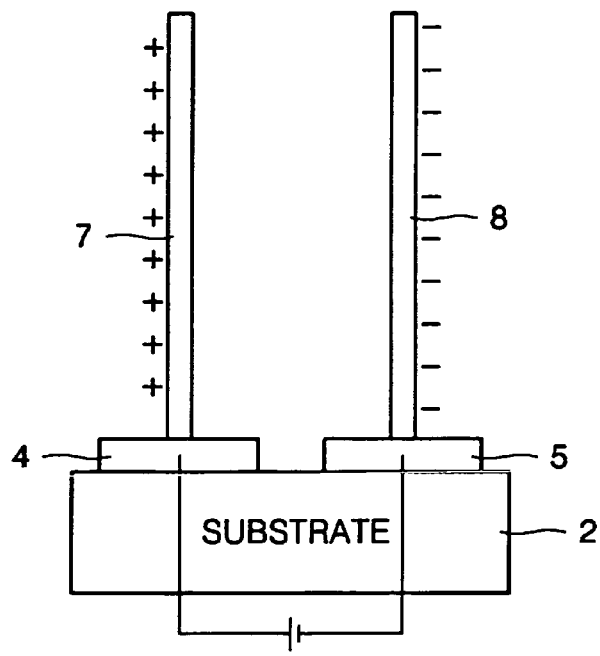
FIG. 1 is a schematic cross-sectional view of a switching device.

Hereinafter, nanowire-based electromechanical devices and methods of fabricating the same according to preferred embodiments of the present invention will be described more fully with reference to the accompanying drawings. In the drawings, the thicknesses of layers and regions are exaggerated for clarity.

Figure 2:
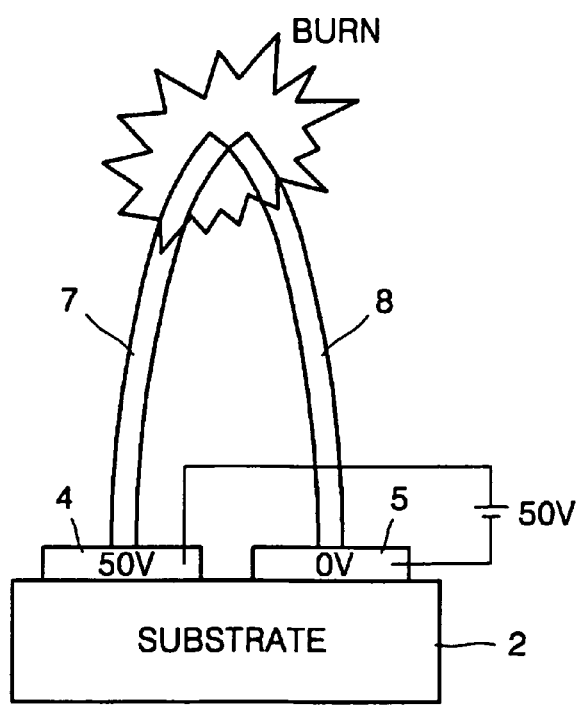
FIG. 2 is a cross-sectional view illustrating the on-state of the switching device of FIG. 1.

FIG. 1 is a schematic cross-sectional view of a switching device, and FIG. 2 is a cross-sectional view illustrating the on-state of the switching device of FIG. 1.

Referring to FIG. 1, the nanowire switching device comprises an insulating substrate 2, first and second electrodes 4 and 5, respectively, disposed on the insulating substrate 2, and first and second nanowires 7 and 8, respectively, vertically grown on the first and second electrodes 4 and 5, respectively. When a predetermined voltage difference is applied between the first and second electrodes 4 and 5, respectively, positive and negative charges are accumulated on the first and second nanowires 7 and 8, respectively. An attractive electrostatic force acts between the first and second nanowires 7 and 8, respectively, to electrically deform the first and second nanowires 7 and 8, respectively, so that distal ends of the first and second nanowires 7 and 8, respectively, contact each other and are switched on. However, a high driving voltage of 25 V to 50 V should be applied between the first and second electrodes 4 and 5, respectively, to induce elastic deformation of the nanowires 7 and 8 for the two-electrode switching device. When the high driving voltage is applied, high current flows through the nanowires 7 and 8 which can lead to arcing or burning of the distal ends of the nanowires 7 and 8, respectively, contacting each other. The arcing or burning not only degrades switching characteristics, but also reduces the lift span of the switching device.

Figure 3:
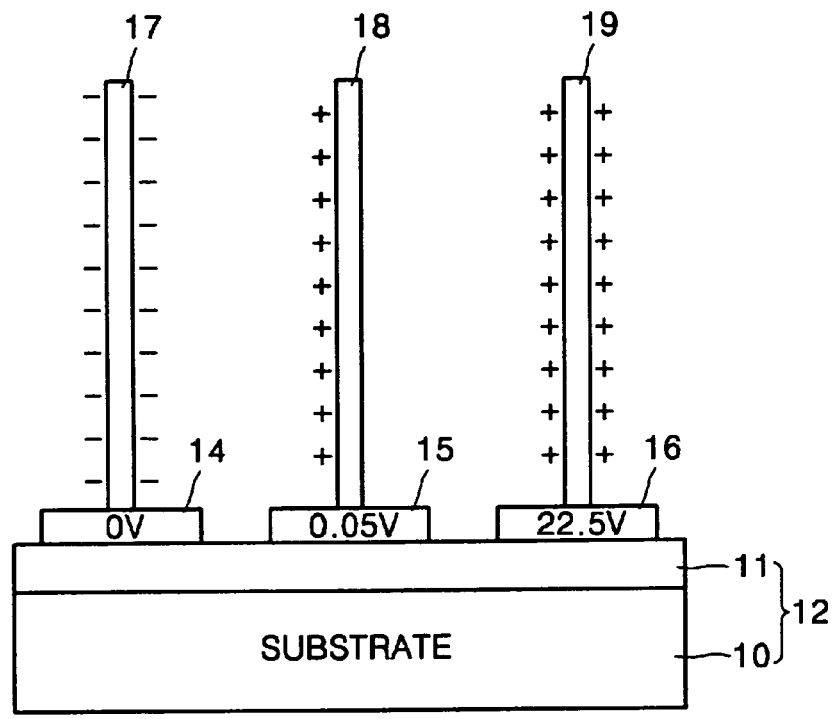
FIG. 3 is a schematic cross-sectional view of a nanowire electromechanical device according to a first embodiment of the present invention.
Figure 4:
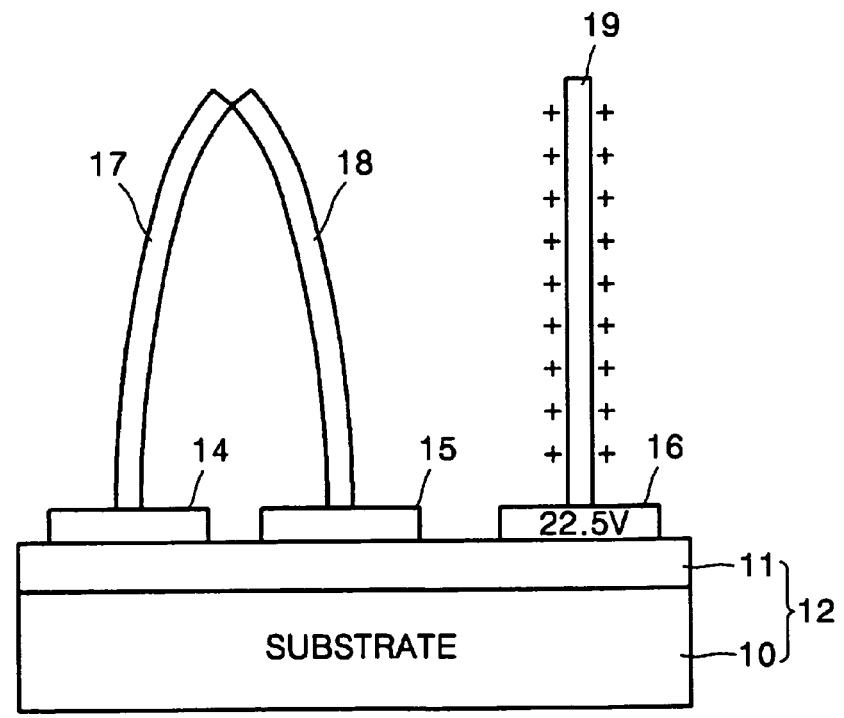
FIG. 4 is a cross-sectional view illustrating the on-state of the nanowire electromechanical device of FIG. 3.

FIG. 3 is a schematic cross-sectional view of a nanowire electromechanical device according to a first embodiment of the present invention, and FIG. 4 is a cross-sectional view illustrating the on-state of the nanowire electromechanical device of FIG. 3.

Referring to FIGS. 3 and 4, the nanowire electromechanical device according to the first embodiment of the present invention comprises an insulating substrate 12, first thru third electrodes 14 thru 16, respectively, disposed on the insulating substrate 12, and first thru third nanowires 17 thru 19, respectively, vertically grown on the first thru third electrodes 14 thru 16, respectively. The insulating substrate 12 may be a glass substrate, a plastic substrate, or other substrate designed to have insulating characteristics. For example, the insulating substrate 12 may include a silicon (Si) substrate 10 and a silicon dioxide ($SiO_2$) insulating layer 111 formed on the insulating substrate 12.

More specifically, the first thru third electrodes 14 thru 16, respectively, are spaced apart from one another, and are disposed sequentially in a row. Each of the first thru third electrodes 14 thru 16, respectively, is formed of one material selected from the group consisting of Nb, Cr, Mo, W, Ti, Pt, Au, ITO, and Ag. Each of the first thru third nanowires 17 thru 19, respectively, is formed of one material selected from the group consisting of carbon-based material, Pt-based material, Si-based material, GaN-based material, GaAs-based material, and ZnO-based material. For example, each of the first thru third nanowires 17 thru 19, respectively, may be carbon fiber, carbon nanotube (CNT), Pt wire, Si wire, GaN wire, GaAs wire, or ZnO wire. The first thru third nanowires 17 thru 19, respectively, have a diameter of 70 nm and a height of 1 to 3 μm.

In the nanowire electromechanical device having the above-mentioned configuration, when negative (−) and positive (+) voltages are applied to the first and third electrodes 14 and 16, respectively, the first and third nanowires 17 and 19, respectively, are charged with negative and positive charges, respectively, due to a voltage difference therebetween. A positive voltage significantly lower than that applied to the third electrode 16 is applied to the second electrode 15, and the second nanowire 18 is charged with a minute amount of charge corresponding to the magnitude of the voltage applied to the second electrode 15. When predetermined amounts of charge are accumulated on the first thru third nanowires 17 thru 19, respectively, an attractive electrostatic force acts between the first and second nanowires 17 and 18, respectively, while a repulsive electrostatic force acts between the second and third nanowires 18 and 19, respectively. In particular, electrostatic forces among the first thru third nanowires 17 thru 19, respectively, may be controlled depending on the amount of charge on the third nanowire 19. The voltage difference between the first and third electrodes 14 and 16, respectively, may be less than 100 V. For example, the voltages applied to the second and third electrodes 15 and 16, respectively, may be lower than 50 and 100 V, respectively. In the present embodiment, voltages of 0 V, 0.05 V, and 22.5 V are applied to the first thru third electrodes 14 thru 16, respectively.

The first and second nanowires 17 and 18, respectively, are elastically deformed (bent) due to electrostatic forces among the first thru third nanowires 17 thru 19, respectively, so that their distal ends contact one another, thus enabling switching-on operation. Most of the electrostatic forces that can elastically deform the first and second nanowires 17 and 18, respectively, depend on the amounts of charge accumulated on the first and third nanowires 17 and 19, respectively, due to the voltage difference between the first and third electrodes 14 and 16, respectively. Thus, even if a minute amount of voltage is applied to the second electrode 15, the nanowire electromechanical device according to the present invention is able to perform sufficient switching operation without difficulty. Because the voltage difference between the nanowires 17 and 18 is sufficiently small, the nanowire electromechanical device of the present invention can provide stable switching characteristics while preventing the occurrence of burning during switching-on operation.

The first and second nanowires 17 and 18, respectively, that are switched on have an elastic restoring force. When the elastic restoring force is greater than the Van der Waals force, the first and second nanowires 17 and 18, respectively, can be restored to their original shape without applied electrical biases. Conversely, when the first and second nanowires have an elastic restoring force that is less than the Van der Waals force, the first and second nanowires 17 and 18, respectively, may remain in the switched on state without applied electrical biases. By using the difference between magnitudes of the elastic restoring force and the Van der Waals force, it is possible to implement switching on/off operations.

Thus, the nanowire electromechanical device of the present invention can provide stable switching characteristics by causing the distal ends of the first and second nanowires 17 and 18, respectively, to be in contact or non-contact with each other according to electrostatic forces among the first thru third nanowires 17 thru 19, respectively, and the difference between the magnitudes of the elastic restoring force and the Van der Waals force.

In particular, when a capacitor used for memory back-up is connected to the first electrode 14 or the second electrode 15 in the nanowire electromechanical device having such switching characteristics, the nanowire electromechanical device may act as a dynamic random access memory device.

Figure 5:
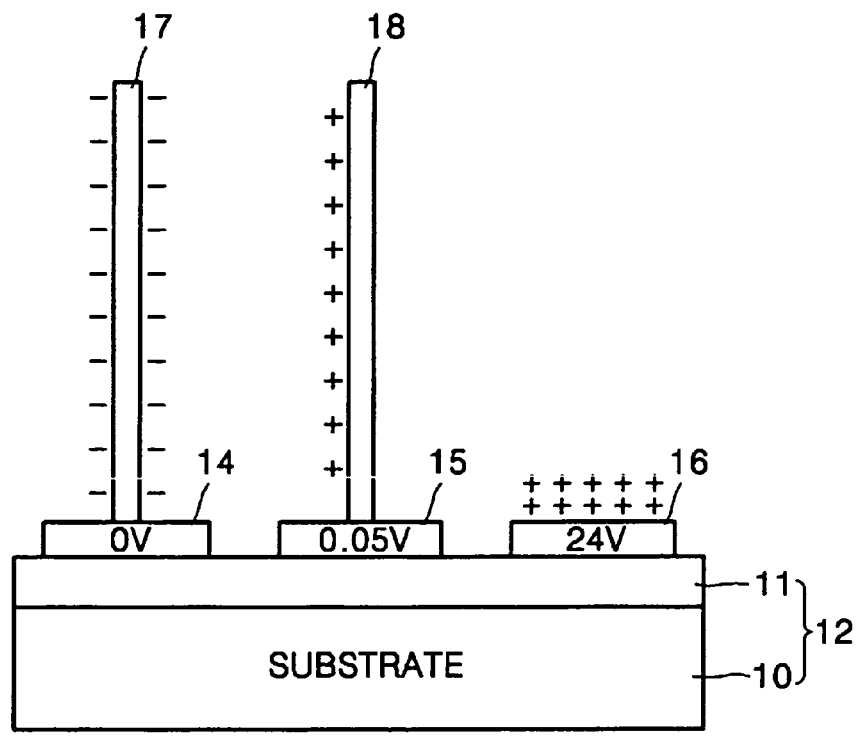
FIG. 5 is a schematic cross-sectional view of a nanowire electromechanical device according to a second embodiment of the present invention.
Figure 6:
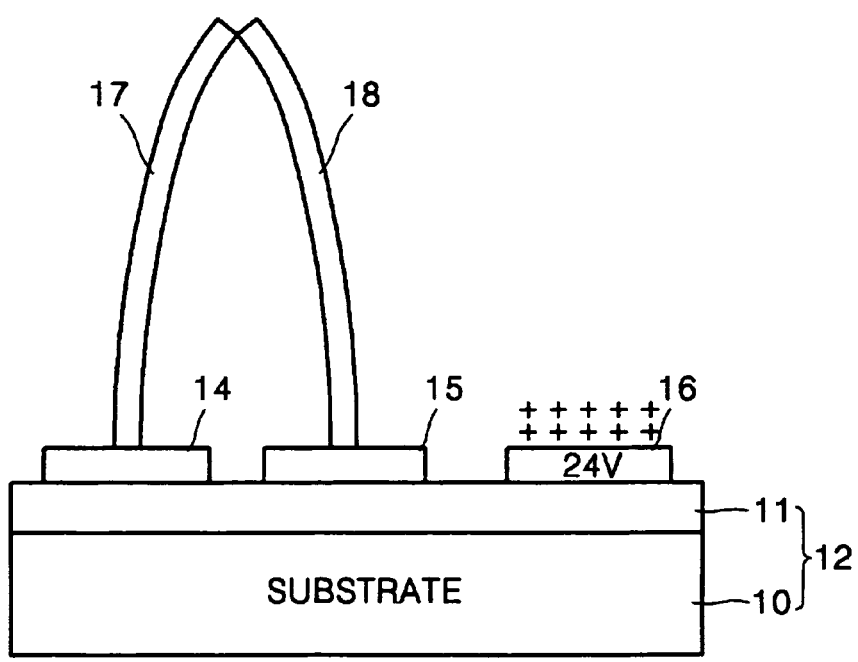
FIG. 6 is a cross-sectional view illustrating the on-state of the nanowire electromechanical device of FIG. 5.

FIG. 5 is a schematic cross-sectional view of a nanowire electromechanical device according to a second embodiment of the present invention and FIG. 6 is a cross-sectional view illustrating the on-state of the nanowire electromechanical device of FIG. 5.

Referring to FIGS. 5 and 6, the nanowire electromechanical device according to the second embodiment of the present invention includes an insulating substrate 12, first thru third electrodes 14 thru 16, respectively, disposed on the insulating substrate 12, and first and second nanowires 17 and 18, respectively, vertically grown on the first and second electrodes 14 and 15, respectively. Like reference numerals in the first and second embodiments denote like elements, and thus their description will be omitted.

The second embodiment is a modified example of the first embodiment. In contrast to the first embodiment, the nanowire electromechanical device according to the second embodiment of the present invention does not include a third nanowire. When a sufficient amount of voltage is applied to the third electrode 16 in the second embodiment, the first and second nanowires 17 and 18, respectively, can show switching characteristics without a third nanowire. To this end, the voltage applied to the third electrode 16 is greater than that in the first embodiment. In the second embodiment, voltages of 0V, 0.05V, and 24V are applied to the first thru third electrodes 14 thru 16, respectively, to implement switching operation of the nanowire electromechanical device.

Figure 7A:
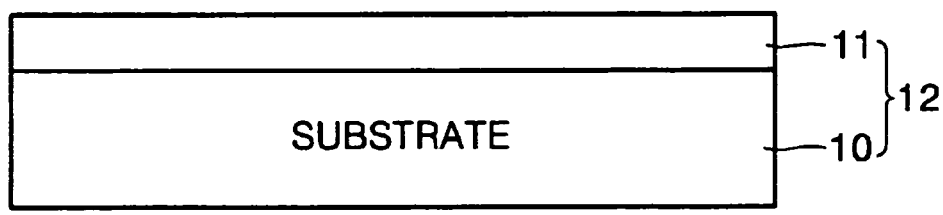
FIGS. 7A-7E illustrate steps of a process of fabricating a nanowire electromechanical device according to a preferred embodiment of the present invention.
Figure 7B:
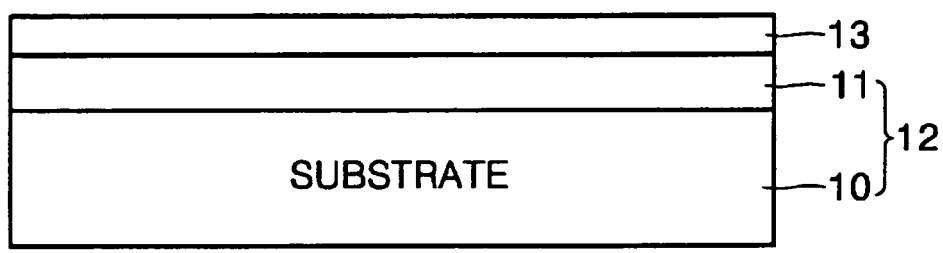

FIGS. 7A-7E illustrate steps in a process of fabricating a nanowire electromechanical device according to a preferred embodiment of the present invention. Referring to FIGS. 7A and 7B, an insulating substrate 12 is prepared, and an electrode layer 13 is formed on the insulating substrate 12. The insulating substrate 12 includes a Si substrate 10 and a $SiO_2$ insulating layer 111 formed on the Si substrate 10. Alternatively, the insulating substrate 12 may be a glass or plastic substrate. The electrode layer 13 is formed of one material selected from the group consisting of Nb, Cr, Mo, W, Ti, Pt, Au, ITO, and Ag.

Figure 7C:
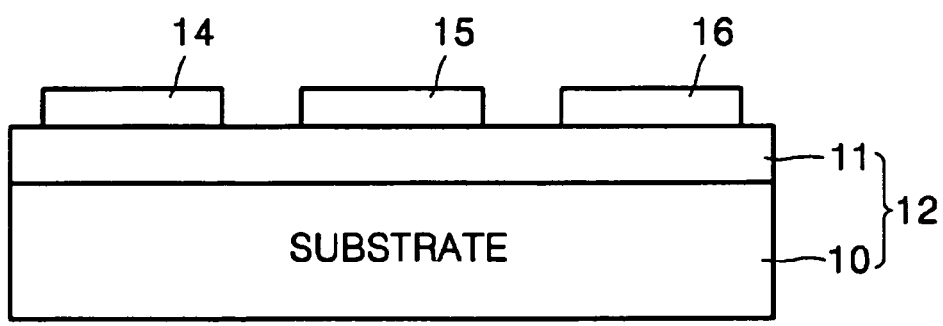
Figure 7D:
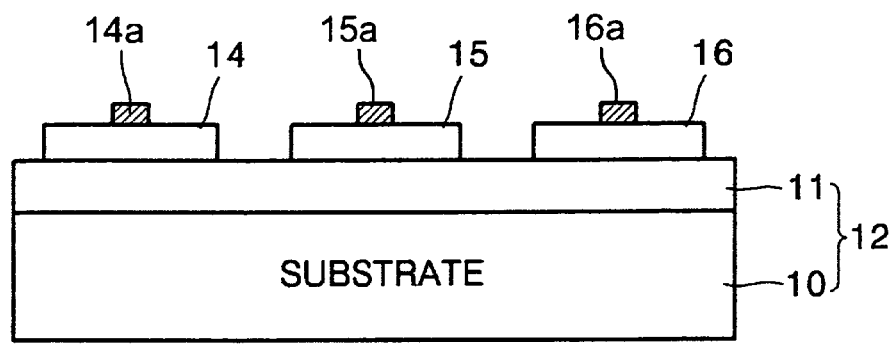

Referring to FIGS. 7C and 7D, the electrode layer 13 is patterned at predetermined intervals to form first thru third electrodes 14 thru 16, respectively, sequentially disposed in a row. Then, catalysts 14a thru 16a are deposited on the first thru third electrodes 14 thru 16, respectively, which facilitates vertical growth of nanowire. The catalysts 14a thru 16a are formed of at least one material selected from the group consisting of Ni, invar, Fe, Co, and Au.

Figure 7E:
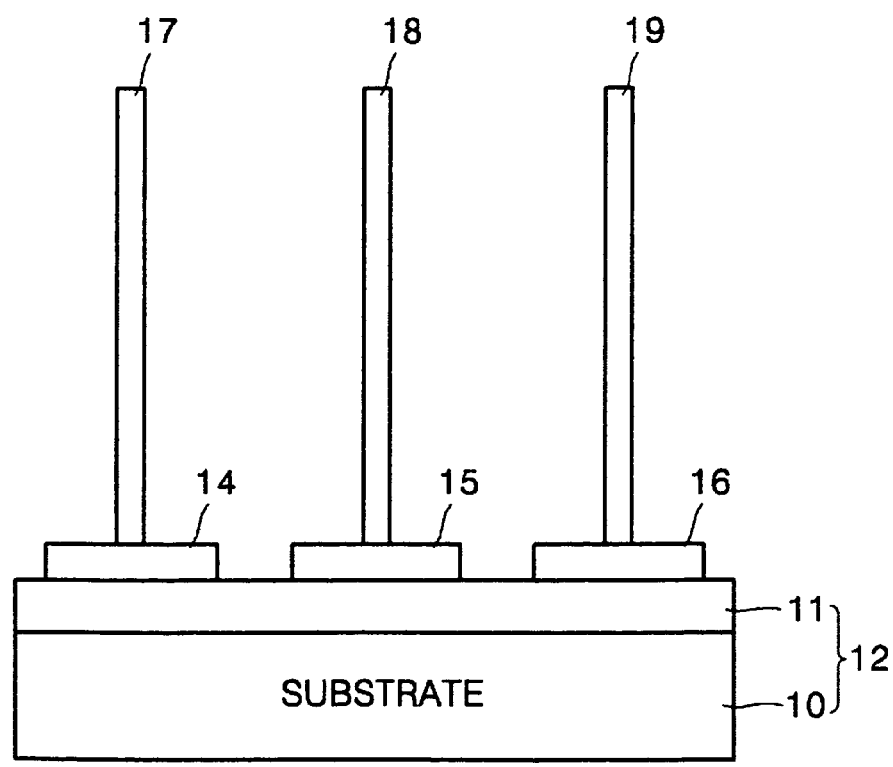

Referring to FIG. 7E, first thru third nanowires 17 thru 19, respectively, are vertically grown on the catalysts 14a thru 16a, respectively. Each of the first thru third nanowires 17 thru 19, respectively, may be formed of one material selected one material selected from the group consisting of carbon-based material, Pt-based material, Si-based material, GaN-based material, GaAs-based material, and ZnO-based material. For example, each of the first thru third nanowires 17 thru 19, respectively, may be formed of one material selected from the group consisting of carbon fiber, carbon nanotube (CNT), Pt wire, Si wire, GaN wire, GaAs wire, and ZnO wire. The first thru third nanowires 17 thru 19, respectively, have a diameter of 70 nm and a height of 1 to 3 μm.

EXPERIMENTAL EXAMPLE 1

After depositing Ni catalysts on Nb electrodes (first thru third electrodes), first thru third multi-wall CNT (MWCNT) nanowires were vertically grown using plasma enhanced chemical vapor deposition (PECVD) from a gas mixture of $C_2H_2$ and $NH_3$ at 600° C. The height and diameter of the first thru third MWCNT nanowires were 2 μm and 70 nm, respectively.

Figure 8:
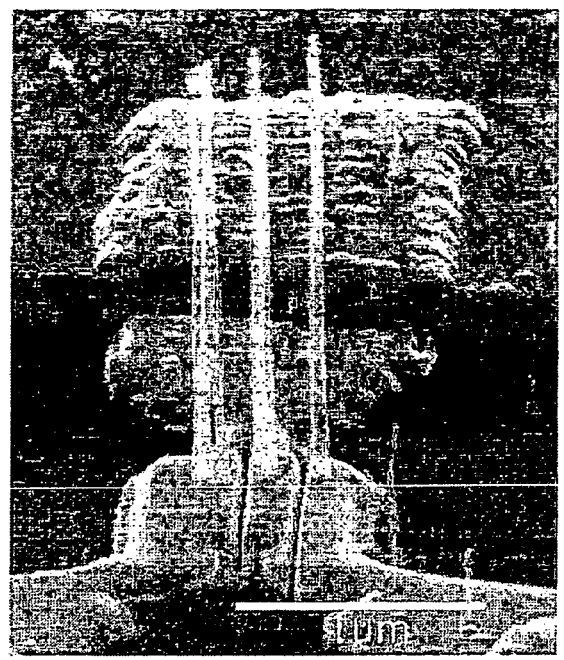
FIG. 8 shows a scanning electron microscope (SEM) photograph of a nanowire electromechanical device fabricated in Experimental Example 1.
Figure 9:
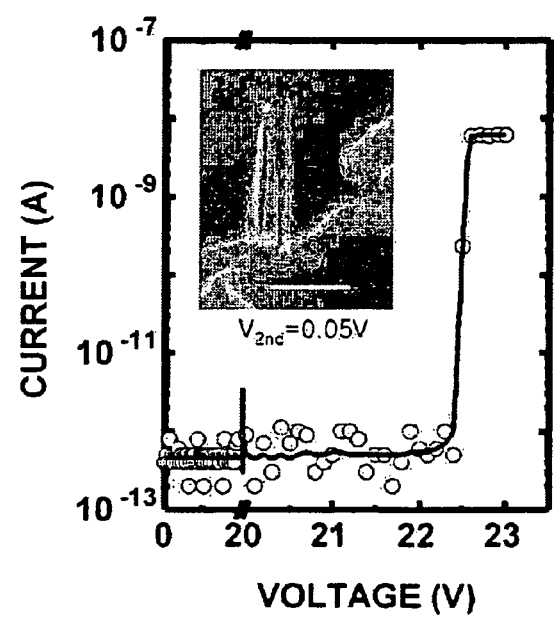
FIG. 9 is a graph illustrating current-voltage (I-V) characteristics of the nanowire electromechanical device of FIG. 8.

FIG. 8 shows a scanning electron microscope (SEM) photograph of a nanowire electromechanical device fabricated in Experimental Example 1, and FIG. 9 is a graph illustrating current-voltage (I-V) characteristics of the nanowire electromechanical device of FIG. 8.

Referring to FIG. 9, after being switched on by mechanical moving, the first and second nanowires were kept switched on, even after a voltage applied to the third electrode was removed. Voltages of 0 V, 0.05 V, and 22.5 V were applied to the first thru third electrodes, respectively.

EXPERIMENTAL EXAMPLE 2

After depositing Ni catalysts on Nb electrodes (first thru third electrodes), first and second (MWCNT) nanowires were vertically grown using PECVD from a gas mixture of $C_2H_2$ and $NH_3$ at 600° C. The height and diameter of the first and second MWCNT nanowires were 2 μm and 70 nm, respectively.

Figure 10:
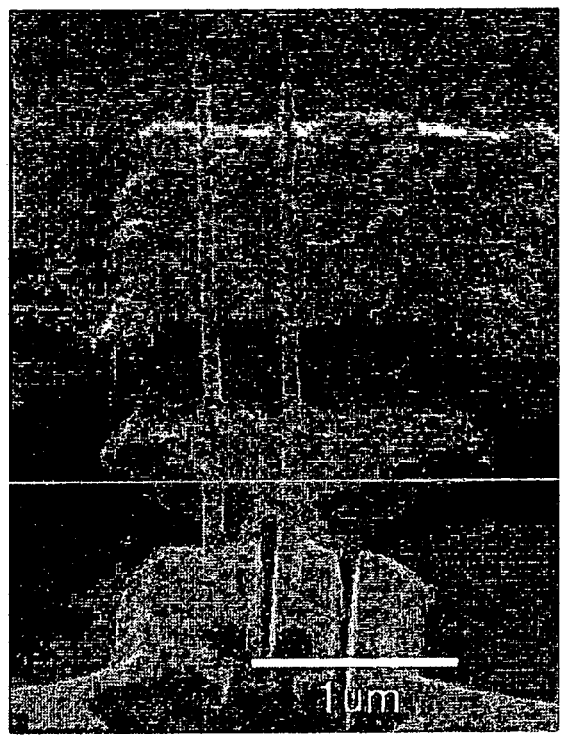
FIG. 10 shows an SEM photograph of a nanowire electromechanical device fabricated in Experimental Example 2.
Figure 11:
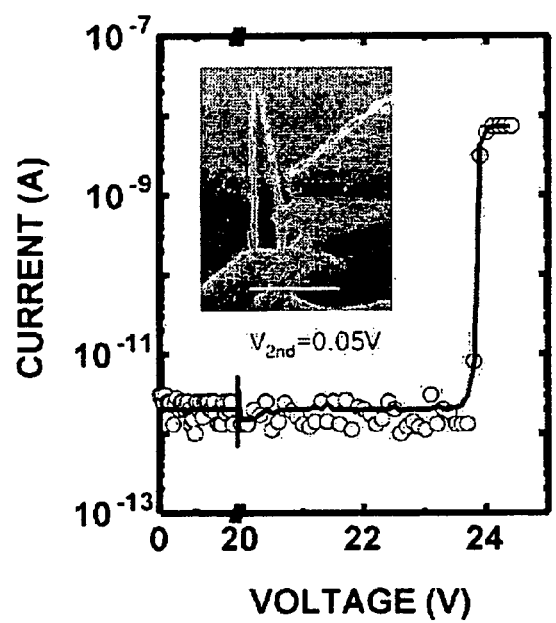
FIG. 11 is a graph illustrating current-voltage (I-V) characteristics of the nanowire electromechanical device of FIG. 10.

FIG. 10 shows an SEM photograph of a nanowire electromechanical device fabricated in Experimental Example 2, and FIG. 11 is a graph illustrating I-V characteristics of the nanowire electromechanical device of FIG. 10.

Referring to FIG. 1, after being switched on by mechanical moving, the first and second nanowires were kept switched on, even after a voltage applied to the third electrode was removed. Voltages of 0 V, 0.05 V, and 24 V were applied to the first thru third electrodes, respectively.

EXPERIMENTAL EXAMPLE 3

After depositing Ni catalysts on Nb electrodes (first thru third electrodes), first and second (MWCNT) nanowires were vertically grown using PECVD from a gas mixture of $C_2H_2$ and $NH_3$ at 600° C. The height and diameter of the first and second MWCNT nanowires were 1.3 μm and 70 nm, respectively. The lower first and second nanowires provided a higher elastic force.

Figure 12:
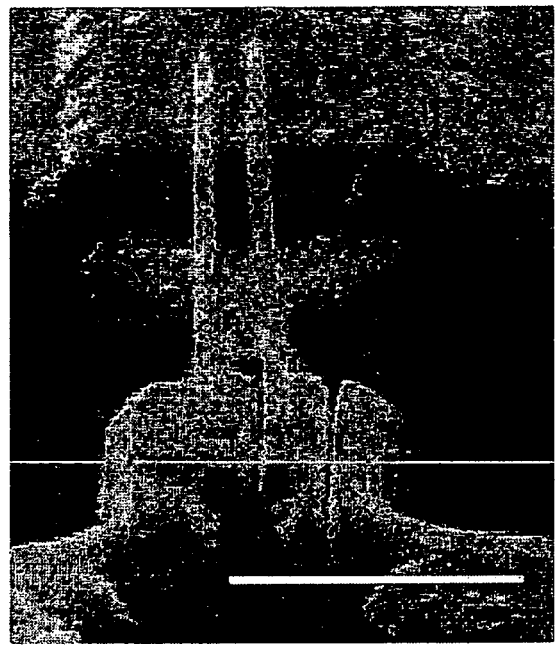
FIG. 12 shows an SEM photograph of a nanowire electromechanical device fabricated in Experimental Example 3.
Figure 13:
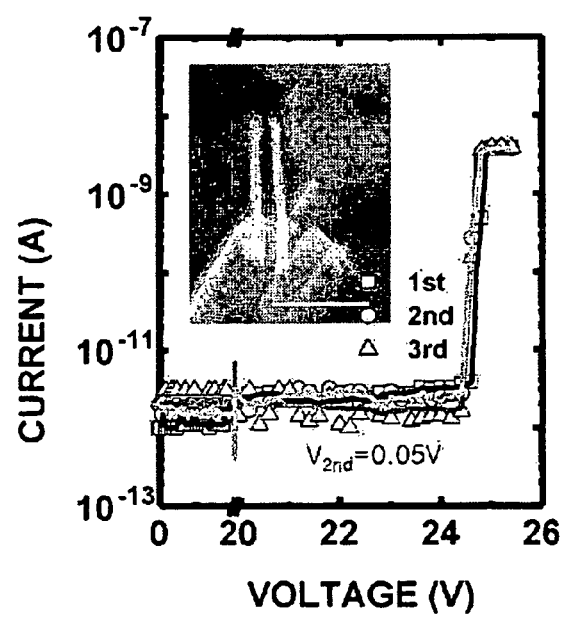
FIG. 13 is a graph illustrating I-V characteristics of the nanowire electromechanical device of FIG. 12.

FIG. 12 shows an SEM photograph of a nanowire electromechanical device fabricated in Experimental Example 3, and FIG. 13 is a graph illustrating I-V characteristics of the nanowire electromechanical device of FIG. 12.

Referring to FIG. 13, after being switched on by mechanical moving, the first and second nanowires became switched off when a voltage applied to the third electrode is removed. Voltages of 0 V, 0.05 V, and 24.5 V were applied to the first thru third electrodes, respectively.

A nanowire electronmechanical device having the above-mentioned configuration according to the present invention can prevent burning of two nanowires which are switched on by contacting each other, while providing stable on-off switching characteristics. The nanowire electronmechanical device has excellent switching characteristics and high mobility compared to a conventional silicon transistor. The nanowire electronmechanical device can also be fabricated in nano-sizes, and thus can be realized as an ultra-highly integrated switching device. In particular, the nanowire electronmechanical device has a very simple structure and is easy to manufacture, thereby providing high reproducibility and reliability.

While the present invention has been particularly shown and described with reference to exemplary embodiments thereof, it will be understood by those of ordinary skill in the art that the embodiments described above are given by way of illustration and are not limited, and that various changes in structure, arrangement and other details may be made therein without departing from the spirit and scope of the present invention as defined by the following claims.

What is claimed is:

1. A nanowire electromechanical device, comprising: an electrically insulating substrate; a first electrode for providing a predetermined non-positive electrical potential and being disposed on the electrically insulating substrate; a third electrode for providing a first predetermined positive electrical potential and being disposed on the electrically insulating substrate and spaced apart from the first electrode; a second electrode for providing a second predetermined positive electrical potential, and being interposed between the first and third electrodes and disposed on the electrically insulating substrate, with the second positive electrical potential being constant and lower than the first positive electrical potential; a first nanowire grown to extend transversely away from the first electrode with a proximal end of the first nanowire electrically coupled to the first electrode, and a surface of the first nanowire carrying negative electrical charge induced by the predetermined non-positive electrical potential provided by the first electrode; a second nanowire grown to extend transversely away from the second electrode with a proximal end of the second nanowire electrically coupled to the second electrode, and a surface of the second nanowire carrying second positive electrical charge induced by the second predetermined positive electrical potential provided by the second electrode; and a third nanowire grown to extend transversely away from the third electrode with a proximal end of the third nanowire electrically coupled to the third electrode, and a surface of the third nanowire carrying first positive electrical charge induced by the first predetermined positive electrical potential provided by the third electrode, with an amount of the second positive electrical charge being less compared to an amount of the first electrical charge; and electrostatic forces produced by potentials applied to the first and second nanowires deform the first and second nanowires so that distal ends of the first and second nanowires contact one another.

2. The nanowire electromechanical device of claim 1, wherein the elastic restoring forces of the first and second nanowires are greater than a Van der Waals force acting between the first and second nanowires.

3. The nanowire electromechanical device of claim 1, wherein the elastic restoring forces of the first and second nanowires are less than a Van der Waals force acting between the first and second nanowires.

4. The nanowire electromechanical device of claim 1, wherein each of the first, second and third electrodes is formed of at least one material selected from a group consisting of niobium (Nb), chrome (Cr), molybdenum (Mo), tungsten (W), titanium (Ti), platinum (Pt), gold (Au), indium tin oxide (ITO), and silver (Ag), wherein each of the first, second and third nanowires is formed of one material selected from a group consisting of carbon-based material, Pt-based material, Si-based material, GaN-based material, GaAs-based material, and ZnO-based material.

5. The nanowire electromechanical device of claim 1, wherein each of the first, second and third nanowires has a diameter of 70 nm, and a height in a range of 1 to 3 μm.

6. The nanowire electromechanical device of claim 1, wherein a voltage difference between the first and third electrodes is less than 100 V.

7. The nanowire electromechanical device of claim 6, wherein the voltage applied to the third electrode is lower than 100 V.

8. The nanowire electromechanical device of claim 7, wherein the voltage applied to the second electrode is lower than 50 V.

9. A nanowire electromechanical device, comprising: an electrically insulating substrate; a first electrode for providing a predetermined non-positive electrical potential and being disposed on the electrically insulating substrate; a third electrode for providing a first predetermined positive electrical potential and being disposed on the electrically insulating substrate and spaced apart from the first electrode; a second electrode for providing a second predetermined positive electrical potential, and being interposed between the first and third electrodes and disposed on the electrically insulating substrate, with the second positive electrical potential being constant and lower than the first positive electrical potential; a first nanowire grown to extend transversely away from the first electrode with a proximal end of the first nanowire electrically coupled to the first electrode, and a surface of the first nanowire carrying negative electrical charge induced by the predetermined non-positive electrical potential provided by the first electrode; a second nanowire grown to extend transversely away from the second electrode with a proximal end of the second nanowire electrically coupled to the second electrode, and a surface of the second nanowire carrying second positive electrical charge induced by the second predetermined positive electrical potential provided by the second electrode; and a surface of the third electrode carrying first positive electrical charge induced by the first predetermined positive electrical potential provided by the third electrode, with the surface of the third electrode being different from a surface where the third electrode is disposed on the electrically insulating substrate, and with an amount of the second positive electrical charge being less compared to an amount of the first electrical charge; and electrostatic forces produced by potentials applied to the first and second nanowires deform the first and second nanowires so that distal ends of the first and second nanowires contact one another.

10. The nanowire electromechanical device of claim 9, wherein the elastic restoring forces of the first and second nanowires are greater than a Van der Waals force acting between the first and second nanowires.

11. The nanowire electromechanical device of claim 9, wherein the elastic restoring forces of the first and second nanowires are less than a Van der Waals force acting between the first and second nanowires.

12. The nanowire electromechanical device of claim 9, wherein each of the first, second and third electrodes is formed of at least one material selected from a group consisting of niobium (Nb), chrome (Cr), molybdenum (Mo), tungsten (W), titanium (Ti), platinum (Pt), gold (Au), indium tin oxide (ITO), and silver (Ag).

13. The nanowire electromechanical device of claim 9, wherein the first and second nanowires are formed of one material selected from a group consisting of carbon-based material, Pt-based material, Si-based material, GaN-based material, GaAs-based material, and ZnO-based material.

14. The nanowire electromechanical device of claim 13, wherein at least one of the first and second nanowires is formed of one material selected from a group consisting of carbon fiber, carbon nanotube (CNT), Pt wire, Si wire, GaN wire, GaAs wire, and ZnO wire.

15. The nanowire electromechanical device of claim 14, wherein at least one of the first and second nanowires has a diameter of 70 nm.

16. The nanowire electromechanical device of claim 15, wherein at least one of the first and second nanowires has a height in a range of 1 to 3 μm.

17. The nanowire electromechanical device of claim 9, wherein a voltage difference between the first and third electrodes is less than 100 V.

18. The nanowire electromechanical device of claim 17, wherein the voltage applied to the third electrode is lower than 100 V.

19. The nanowire electromechanical device of claim 18, wherein the voltage applied to the second electrode is lower than 50 V.

20. A method of fabricating and operating a nanowire electromechanical device, comprising the steps of:
  preparing an insulating substrate;
  forming an electrode layer on the insulating substrate;
  patterning the electrode layer to form first, second and third electrodes spaced apart from each other and disposed sequentially in a row;
  vertically growing first and second nanowires on the first and second electrodes, respectively;
  applying a negative voltage and a positive voltage varying within a predetermined range to the first and third electrodes, respectively; and
  applying a constant positive voltage, lower than the voltage applied to the third electrode, to the second electrode.

21. The method of claim 20, wherein the step of vertically growing the first and second nanowires comprises:
  depositing catalysts on the first and second electrodes; and
  growing the first and second nanowires on the catalysts deposited on the first and second electrodes, respectively.

22. The method of claim 21, wherein the catalyst is formed of at least one material selected from a group consisting of nickel (Ni), invar, iron (Fe), cobalt (Co), and gold (Au).

23. The method of claim 20, wherein the electrode layer is formed of at least one material selected from a group consisting of niobium (Nb), chrome (Cr), molybdenum (Mo), tungsten (W), titanium (Ti), platinum (Pt), Au, indium tin oxide (ITO), and silver (Ag).

24. The method of claim 20, wherein the first and second nanowires are formed of one material selected from a group consisting of carbon-based material, Pt-based material, Si-based material, GaN-based material, GaAs-based material, and ZnO-based material.

25. The method of claim 24, wherein at least one of the first and second nanowires is formed of one material selected from a group consisting of carbon fiber, carbon nanotube (CNT), Pt wire, Si wire, GaN wire, GaAs wire, and ZnO wire.

26. The method of claim 25, wherein at least one of the first and second nanowires has a diameter of 70 nm.

27. The method of claim 26, wherein at least one of the first and second nanowires has a height in a range of 1 to 3 μm.

28. The method of claim 20, further comprising the step of vertically growing a third nanowire on the third electrode.

29. The method of claim 28, wherein the step of vertically growing the third nanowire on the third electrode comprises:
  depositing a catalyst on the third electrode; and
  growing the third nanowire on the catalyst deposited on the third electrode.

30. The method of claim 29, wherein the catalyst is formed of at least one material selected from a group consisting of Ni, invar, Fe, Co, and Au.

31. The method of claim 30, wherein the third nanowire is formed of one material selected from a group consisting of carbon-based material, Pt-based material, Si-based material, GaN-based material, GaAs-based material, and ZnO-based material.

32. The method of claim 31, wherein the third nanowire is formed of one material selected from a group consisting of carbon fiber, carbon nanotube (CNT), Pt wire, Si wire, GaN wire, GaAs wire, and ZnO wire.

33. The method of claim 32, wherein the third nanowire has a diameter of 70 nm.

34. The method of claim 33, wherein the third nanowire has a height in a range of 1 to 3 μm.

35. A nanowire electromechanical device fabricated by the method of claim 20, wherein:
the first and the third electrodes formed on the electrode layer are spaced apart from each other on the insulating substrate;
the second electrode is interposed between the first and third electrodes;
the first nanowire is vertically grown on the first electrode and is charged with a negative charge;
the second nanowire is vertically grown on the second electrode and is charged with a positive charge; and
distal ends of the first and the second nanowires are selectively in contact and not in contact with each other due to electrostatic forces among the first and second nanowires and the third electrode controlled according to a magnitude of the voltage applied to the third electrode, elastic restoring forces of the first and second nanowires, and Van der Waals forces acting between the first and second nanowires, thereby providing switching characteristics.

36. A nanowire electromechanical device, comprising: an electrically insulating substrate; first and third electrodes spaced apart from each other and formed on the insulating substrate; a second electrode interposed between the first and third electrodes and formed on the insulating substrate; a first nanowire grown to extend transversely away from the first electrode with a proximal end of the first nanowire electrically coupled to receive from the first electrode a negative charge having a magnitude that varies within a predetermined range; a second nanowire grown to extend transversely away from the second electrode with a proximal end of the second nanowire electrically coupled to receive from the second electrode a positive charge; and the first nanowire and the second nanowire being oriented to selectively form an electrical contact in dependence upon electrostatic forces occurring between the first, and second nanowires upon application of said negative charge; and electrostatic forces produced by potentials applied to the first and second nano wires deform the first and second nanowires so that distal ends of the first and second nanowires contact one another.

37. The nanowire electromechanical device of claim 36, comprised of the first and second nanowires providing electrical switching by selectively forming electrical contact between said distal ends of the first and second nanowires in dependence upon electrostatic forces distributed among the first, and second nanowires controlled according to an amount of electrical charge on the third electrode, elastic restoring forces of the first and second nanowires, and Van der Waals forces acting between the first and second nanowires.

* * * * *